US007032154B2

United States Patent
Kidorf et al.

(10) Patent No.: US 7,032,154 B2
(45) Date of Patent: *Apr. 18, 2006

(54) CONCATENATED FORWARD ERROR CORRECTION DECODER

(75) Inventors: Howard D. Kidorf, Red Bank, NJ (US); Franklin W. Kerfoot, III, Red Bank, NJ (US); Nandakumar Ramanujam, Columbia, MD (US); Bo Pedersen, Annapolis, MD (US)

(73) Assignee: Tyco Telecommunications (US) Inc., Morristown, NJ (US)

( * ) Notice: Subject to any disclaimer, the term of this patent is extended or adjusted under 35 U.S.C. 154(b) by 388 days.

This patent is subject to a terminal disclaimer.

(21) Appl. No.: 10/105,598

(22) Filed: Mar. 25, 2002

(65) Prior Publication Data

US 2002/0166091 A1    Nov. 7, 2002

Related U.S. Application Data

(63) Continuation-in-part of application No. 09/993,082, filed on Nov. 14, 2001, now abandoned, and a continuation-in-part of application No. 09/589,215, filed on Jun. 7, 2000, now Pat. No. 6,622,277, and a continuation-in-part of application No. 09/587,741, filed on Jun. 5, 2000, now abandoned.

(51) Int. Cl.
*H03M 13/00* (2006.01)

(52) U.S. Cl. .................. 714/755; 714/784; 714/788

(58) Field of Classification Search ........ 714/784–788, 714/752, 755, 761–762, 756, 792; 375/265
See application file for complete search history.

(56) References Cited

U.S. PATENT DOCUMENTS

| | | | |
|---|---|---|---|
| 5,392,299 A | 2/1995 | Rhines et al. | |
| 5,416,804 A | 5/1995 | Khaled et al. | ............... 375/341 |
| 5,446,747 A | 8/1995 | Berrou | |
| 6,029,264 A | 2/2000 | Kobayashi et al. | ......... 714/755 |
| 6,298,461 B1 * | 10/2001 | Tong et al. | .................. 714/755 |
| 6,622,277 B1 * | 9/2003 | Ramanujam et al. | ........ 714/755 |
| 2002/0056064 A1 * | 5/2002 | Kidorf et al. | ................ 714/755 |

OTHER PUBLICATIONS

Liu et al. Turbo decoding of Reed-Solomon codes through binary decomposition and self concatenation, IEEE International Symposium on Information Theory, p.: 24, Jun. 24-29, 2001.*

O. Ait Sab et al., "Block Turbo Code Performances for Long-Haul DWDM Optical Transmission Systems", *Optical Fiber Communication Conference. Technical Digest Postconference Edition. Trends in Optics and Photonics*, vol. 37 (IEEE Cat. No. 00CH37079), Mar. 7-10, 2000, pp. 280-282, vol. 3, XP-002181576, Baltimore, MD ISBN: 1-55752-630-3.

(Continued)

*Primary Examiner*—Guy J. Lamarre

(57) ABSTRACT

A method and apparatus for performing error correction is described. A stream of data is encoded using concatenated error correcting codes. The encoded data is communicated over a transmission system. The encoded data is decoded using the codes and three levels of decoding.

18 Claims, 13 Drawing Sheets

OTHER PUBLICATIONS

O. Ait Sab et al., "Concatenated Forward Error Correction Schemes for Long-Haul DWDM Optical Transmission Systems", *25th European Conference on Optical Communication. ECOC '99 Conference, Proceedings of ECOC '99. 25th European Conference on Optical Communication, Nice, France*, Sep. 26-30, 1999, pp. 290-291, vol. 2, XP-001039609 1999, Paris, France, Soc. Electr. Electron, France ISBN: 2-912328-12-8.

A. Puc et al., "Concatenated FEC Experiment over 5000 km Long Straight Line WDM Test Bed", OFC/IOOC'99, *Optical Fiber Communication Conference and the International Conference on Integrated Optics and Optical Fiber Communications* (Cat. No. 99CH36322), Feb. 21-26, 1999, pp. 255-258, vol. 3, XP-002181577, San Diego, CA.

D. N. Kalofonos et al., "Performance Comparisons of Concatenated Codes with Iterative Decoding for DS-CDMA Systems with Application to IS-95-Based Cellular Systems", *WCNC. IEEE Wireless Communications and Networking Conference*, vol. 1, Sep. 21, 1999, pp. 461-465, XP-002150138.

C.R. Davidson et al., "1800 Gb/s Transmission of One Hundred and Eighty 10 Gb/s WDM Channels Over 7000 km Using the Full EDFA C-Band", *Optical Fiber Communication Conference, Technical Digest Postconference Edition, Trends in Optics and Photonics*, vol. 37, (IEEE Cat. No. 00Ch37079), Mar. 7-10, 2000, pp. 242-244, vol. 4, XP002181578, Baltimore, MD, ISBN: 1-55752-630-3.

T. Nagayasu et al., "Receiver with Iterative Soft Decision for Frequency Selective Fading Channels", *Electronic Letters*, Apr. 30, 1998, IEE, UK, vol. 34, No. 9, pp. 855-856, XP002181579, ISSN: 0013-5194.

\* cited by examiner

CONCATENATED FORWARD ERROR CORRECTION DECODER

CROSS REFERENCE TO RELATED APPLICATIONS

The present application is a continuation-in-part of U.S. application Ser. No. 09/589,215, filed Jun. 7, 2000, now U.S. Pat. No. 6,622,277, U.S. application Ser. No. 09/587,741 filed Jun. 5, 2000, now abandoned, and U.S. application Ser. No. 09/993,082 filed Nov. 14, 2001, now abandoned, the teachings of which applications are incorporated herein by reference.

FIELD OF THE INVENTION

The invention relates to communications networks in general. More particularly, the invention relates to a method and apparatus to perform forward error correction in a network such as a long-haul communications network.

BACKGROUND OF THE INVENTION

Long-haul communication networks are designed to carry information over relatively long distances, typically in the range of 600–10,000 kilometers. Examples of long-haul communications systems include "undersea" or "submarine" systems that carry signals from one continent to another (e.g., North America to Europe). These systems are typically optical systems given the advantages in terms of capacity and reliability.

One problem associated with long-haul communication systems is maintaining the integrity of the data being communicated. All communication systems are susceptible to noise and pulse distortion to some extent. Long-haul communication systems are particular susceptible to noise and pulse distortion given the greater distances over which they carry information.

Forward Error Correction (FEC) is a technique used to help compensate for this distortion. FEC is essentially the incorporation of a suitable code into a data stream, for the detection and correction of data errors by the system's receiver. A transmitter receives a data stream and encodes the data stream using an FEC encoder. The FEC encoder generates a code for a block of data, which is appended to the block of data. The transmitter sends the encoded block of data over the network. A receiver receives the encoded block of data and runs it through an FEC decoder. The FEC decoder recovers the code and uses it to detect and correct any errors within the received block of data.

The use of FEC in a system provides "margin improvements" to the system. The margin improvements can be used to increase amplifier spacing or increase system capacity. In a Wavelength Division Multiplexing (WDM) system, the margin improvement can be used to increase the bit rate of each WDM channel, or decrease the spacing between WDM channels thereby allowing more channels for a given amplifier bandwidth. Consequently, improvements in FEC techniques directly translate into increased capacity for long-haul communication systems. Accordingly, it can be appreciated that a substantial need exists for an enhanced FEC method and apparatus that improves margin requirements and therefore system capacity.

SUMMARY OF THE INVENTION

One embodiment of the invention comprises a method and apparatus to perform error correction. A stream of data is encoded using concatenated Reed-Solomon and turbo-code error correcting codes. The encoded data is communicated over a transmission system. The encoded data is decoded using the codes and three levels of decoding.

With these and other advantages and features of the invention that will become hereinafter apparent, the nature of the invention may be more clearly understood by reference to the following detailed description of the invention, the appended claims and the several drawings attached herein.

DETAILED DESCRIPTION

Figure 1:
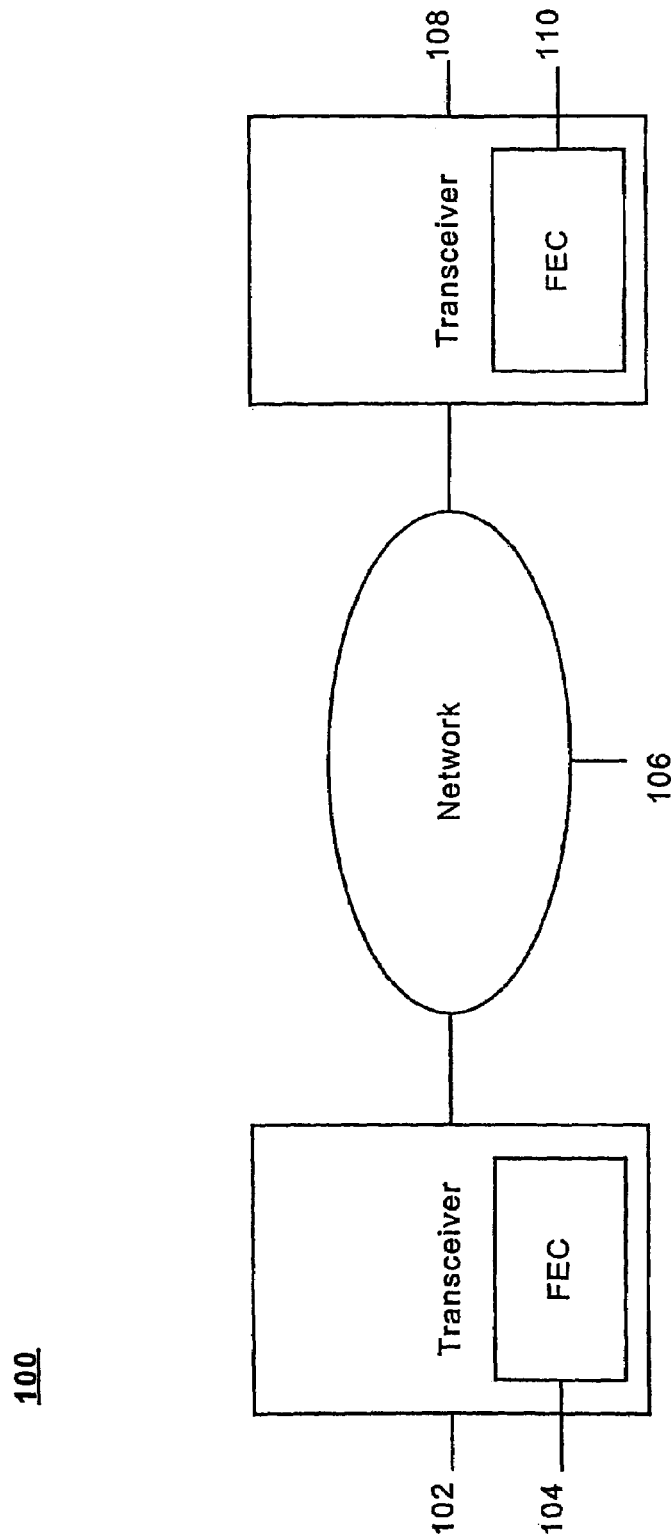
FIG. 1 illustrates a system suitable for practicing one embodiment of the invention.

The embodiments of the invention include a method and apparatus to increase coding gains in a long-haul communications system using concatenated error-correcting codes ("concatenated codes" or "product codes") in conjunction with a three level decoder. A long-haul communications system is defined herein to include any system designed to transport signals over a distance of greater than 600 kilometers. Concatenated codes refer to the use of two or more levels of FEC coding. The performance improvement from concatenated codes arises from the fact that any residual errors from one level of decoding will be corrected in the second or third levels of decoding.

The coding gains for the embodiments of the invention are realized using concatenated codes and two levels of encoding to improve system performance. Concatenated codes are particularly suitable for long-haul communications systems since they increase error correction capabilities with a slight incremental increase in redundancy. Furthermore, RS concatenated codes are well suited for long-haul communications systems since they tend to work well in "bursty" environments. Long-haul communications systems, especially undersea or submarine systems, tend to have more bursty traffic than other systems.

The coding gains for the embodiments of the invention are also realized using three levels of decoding to further improve system performance. In essence, the two levels of encoding are matched at the receiving end by two levels of decoding. In addition, the received data is processed by a third level of decoding that helps remove residual errors. Moreover, the additional error correction is gained without introducing any further redundancy to the transmitted stream of data. This is accomplished by correcting errors through the first two levels of decoding. The received data is then repacked into the original received frames and sent through a third level of decoding using the same error correcting codes used for the first level of decoding. The result is a coding gain of approximately 0.45 dB without the need to add signal redundancy.

There are many types of error-correction codes suitable for use as concatenated codes. Some examples include the linear and cyclic Hamming codes, the cyclic Bose-Chaudhuri-Hocquenghem (BCH) codes, the convolutional (Viterbi) codes, the cyclic Golay and Fire codes, and some newer codes such as the Turbo convolutional and product codes (TCC, TPC). The codes that are frequently used for application in high bit-rate communication systems, however, are a set of cyclic, non-binary, block codes known as Reed-Solomon (RS) codes.

Concatenated codes are designed to have a strong first-level (inner) code (e.g. t=16) and a weaker second-level (outer) code (e.g. t=8), with an interleaving step in between the two. Interleaving re-distributes or "spreads" the errors from an undecodable inner code block over several outer code blocks. The re-distribution or spreading of errors brings the average number of errors per code block to within the error-correction capability of the code at least at the outer decoding level. The interleaver provides an FEC coding improvement corresponding to the depth of interleaving ("interleave depth") as discussed below.

One embodiment of the invention utilizes RS error correcting codes. An RS code word consists of a "block" of n "symbols", k of which represent the data, with the remaining (n−k) symbols representing the redundancy or check symbols. These check symbols are appended to the data symbols during the encoding step, and are used to uniquely detect and correct bit errors at the decoder, within the error-correction capability of the code. After the decoding operation, the check symbols are stripped from the block, and the corrected data symbols are obtained. The data symbols themselves are left unmodified during the encoding step, and it is for this reason that the RS code is referred to as a "systematic" code. The rate of the RS code is the ratio of data symbols (or equivalent, bits) to code word (i.e., data symbols and check symbols) symbols (or bits). The overhead of the code is the ratio of the check symbols to data symbols, i.e. the overhead equals $((1/rate)-1)=(n-k)/k$.

The non-binary nature of block RS codes is manifest in the fact that a code symbol is not a bit but rather it consists of several bits. The typical symbol size, m, is 8 bits, or a standard byte. The number of check symbols used determines the error-correction capability of a particular RS code. For example, a code that can correct t symbol errors in a block of n symbols requires at least 2t check symbols, so that the number of data symbols that can be transmitted in this block is $k=n-2t$. Furthermore, for a given symbol size m, the maximum number of symbols per block, n, has to be less than or equal to $2^m-1$ to ensure unique decodability. For example, for m=8, there is n=255, and for t=8 symbol errors in this case, the maximum number of data symbols is k=239. This is represented in compact form as a 255/239 (n/k) RS code.

RS error correcting schemes also include the use of a shortened RS code. A shortened RS code is one where some of the data symbols are left unused. For example a shortened 223/207 RS code of length $n^*=(n-s)=223$ symbols transmits 207 data symbols in a block with error correction capability of up to 8 symbol errors. The disadvantage of shortened codes, relative to full-length codes, is that they are rate-inefficient. Some practical considerations, such as the maximum number of code-word symbols having to be $n^*(<n)$ in some cases, however, may actually require this form. Shortened codes are implemented in both software and hardware by transforming a (n−s)/(k−s) RS code to an n/k code by padding s dummy symbols (e.g. 0) before encoding. At the decoder, this operation is reversed. After decoding, the padded symbols are stripped from the block.

The decodability of the RS code can be demonstrated with a brief example. If the bit-error rates (BER) of the transmission channel are such that only a single symbol error is expected (t=1), 2t check symbols are required. In the case of an 8-bit symbol (m=8), this translates to 16 check bits. Of the 16 bits in this code, 8 bits are used to uniquely locate the symbol error (one out of $2^8=256$ possibilities, corresponding to one out of 255 symbol positions, in addition to the error-free case). The remaining 8 bits are used to uniquely determine the error pattern (one out of $2^8=256$ error patterns, including the error-free pattern). Various procedures for encoding and decoding RS code words are well known in the art, and therefore will not be further described herein.

The use of concatenated codes provides relatively powerful error correction with relatively little additional processing power. The overhead of a 2-level concatenated RS code can be calculated as $(r_1 \cdot r_2)^{-1}-1$, wherein $r_1$ and $r_2$ are the rates of the inner and outer codes, respectively. The concatenated RS code itself can be represented in compact form as $n_2/k_2-n_1/k_1$, where the subscripts 1 and 2 represent the inner and outer codes, respectively. Conventional FEC coding schemes (e.g. RS 255/239) provide a transmission performance improvement to the Q-factor equivalent of about 5 dB while providing 7% extra bits as redundancy. One embodiment of the invention uses a concatenated RS code that provides an additional coding gain of approximately 2 dB while providing an extra 16% redundancy bits (a total of 23%). The embodiment uses an FEC encoder/decoder using a concatenated RS coding scheme with interleaving between the stages. More particularly, the FEC encoder/decoder utilizes a concatenated RS code of 223/207–255/223.

At least two important discoveries were significant in implementing concatenated codes in long-haul communication systems. The first was the recognition that concatenated codes having an inner code that is stronger (i.e. lower code rate) than the outer code (i.e. higher code rate) is particularly useful in such systems. The second was the recognition that the class of codes utilized for the concatenated code significantly impacted system design.

With respect to the second discovery, two types of combinations were considered particularly advantageous for the long-haul communication systems. The first combination comprised a bit-based BCH inner code and a byte-based RS outer code (referred to herein as "BCH-RS concatenated code"). This is because bit-based BCH codes are good for more uniformly distributed errors while RS codes are good for "bursty" channels. When an inner decoder cannot correct all the errors on the line, it starts generating bursts that can then be effectively handled by the outer RS decoder. The second combination comprised a pair of RS codes (referred to herein as "RS—RS concatenated code"). RS codes having a range from t=2 to t=16 were examined, with t representing a code strength that is defined as the maximal possible number of corrected symbols per code word. The examination revealed that the concatenation of two RS codes of different strength would be particularly effective for undersea systems, provided that the outer code is interleaved before it is concatenated with the inner code. Interleaving is a technique that is normally used to spread bursty errors among several consecutive code words. In this case a deinterleaver is inserted between the two concatenated decoders so that the inner and the outer decoding processes are statistically de-correlated. In general practice, the greater the interleave depth the better coding performance is gained.

The BCH-RS concatenated code and the RS—RS concatenated code each offers advantages according to the needs and constraints of a particular system. For example, the BCH-RS concatenation is good for channels that are both uniform and bursty in nature. The RS—RS concatenation is particularly good for bursty environments. Consequently, the RS—RS concatenation is well suited for undersea communications systems since undersea channels are more bursty in nature.

Another important aspect of implementing an enhanced FEC system concerns digital frame alignment and synchronization in a very noisy environment. This is an important implementation issue because the enhanced FEC must operate at BER values as high as $5 \times 10^{-2}$. The framing and synchronization strategies used in conventional FEC systems are inadequate for conditions where BER is greater than $10^{-4}$.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Referring now in detail to the drawings wherein like parts are designated by like reference numerals throughout, there is illustrated in FIG. 1 a system suitable for practicing one embodiment of the invention. FIG. 1 is a block diagram of a long-haul communications network 100 comprising a communications transmitter 101 and a receiver 107 connected via a transmission line 106. Transmitter 101 contains an FEC encoder 104. Receiver 107 contains an FEC decoder 110. In this embodiment of the invention, long-haul communications network 100 is a conventional long-haul optically amplified undersea communication system with the optical transmitter and receiver modified to operate with a novel FEC codec performing in accordance with a novel concatenated FEC coding scheme and three levels of decoding. Network 100 in general, and transmission line 106 in particular, are designed to transport optical signals over distances greater than 600 kilometers.

Figure 2:
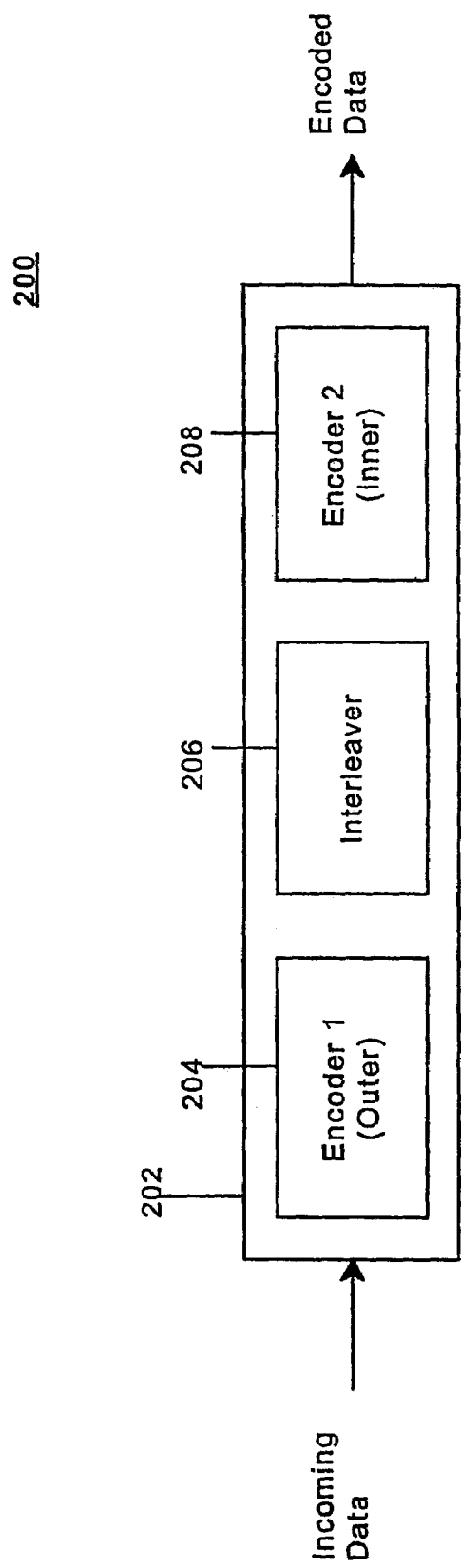
FIG. 2 is a block diagram of an FEC encoder in accordance with one embodiment of the invention.

FIG. 2 is a block diagram of an FEC encoder in accordance with one embodiment of the invention. FIG. 2 illustrates an FEC encoder 200 representative of the structure performing the concatenated encoding function of an FEC encoder 104. FEC encoder 200 comprises a first encoder 204, an interleaver 206 and a second encoder 208. First encoder 204 is also referred to herein as an "outer encoder." Second encoder 208 is also referred to herein as an "inner encoder." The operation of FEC encoder 200 will be discussed in more detail below with reference to FIGS. 4–6 and accompanying examples.

Figure 3:
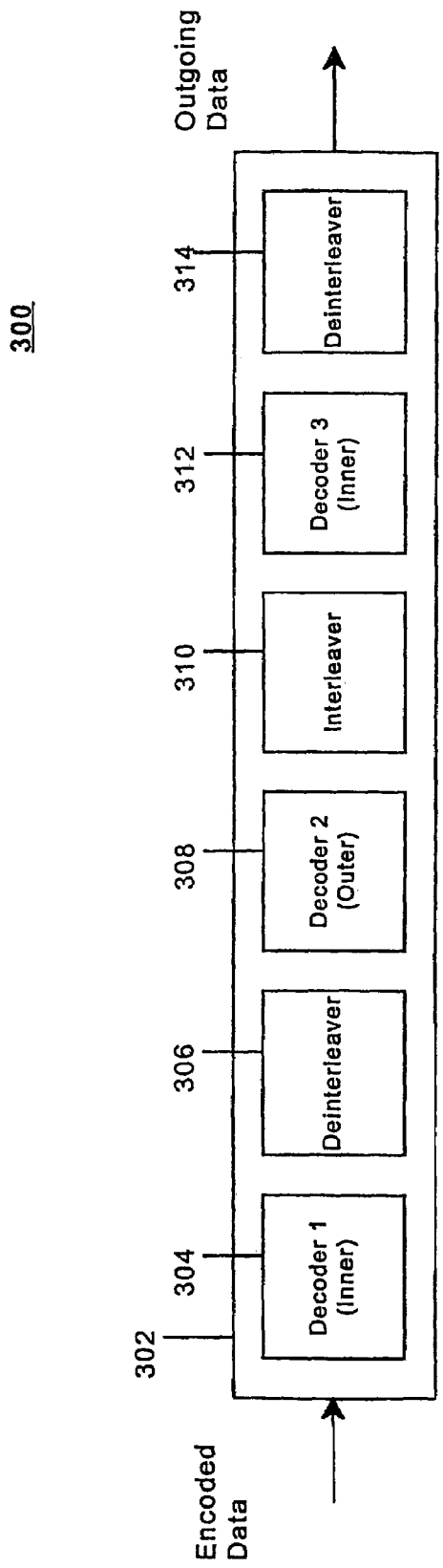
FIG. 3 is a block diagram of an FEC decoder in accordance with one embodiment of the invention.

FIG. 3 is a block diagram of an FEC decoder in accordance with one embodiment of the invention. FIG. 3 illustrates an FEC decoder 300 representative of the structure performing the concatenated decoding function of an FEC decoder 110. FEC decoder 300 comprises a first decoder 304, a deinterleaver 306 a second decoder 308, an interleaver 310, a third decoder 312 and a deinterleaver 314. First decoder 304 is also referred to herein as an "inner decoder." Second decoder 308 is also referred to herein as an "outer decoder." The operation of FEC decoder 300 will also be discussed in more detail below with reference to FIGS. 4–6 and accompanying examples.

For purposes of clarity, the encoding structure and functionality (i.e. FEC encoder 200) is discussed separately from the decoding structure and functionality (i.e. FEC decoder 300). It can be appreciated, however, that both the encoding and decoding structure and functionality can be combined into a single FEC codec (e.g. FEC codecs 104 and 110) and still fall within the scope of the invention.

Figure 4:
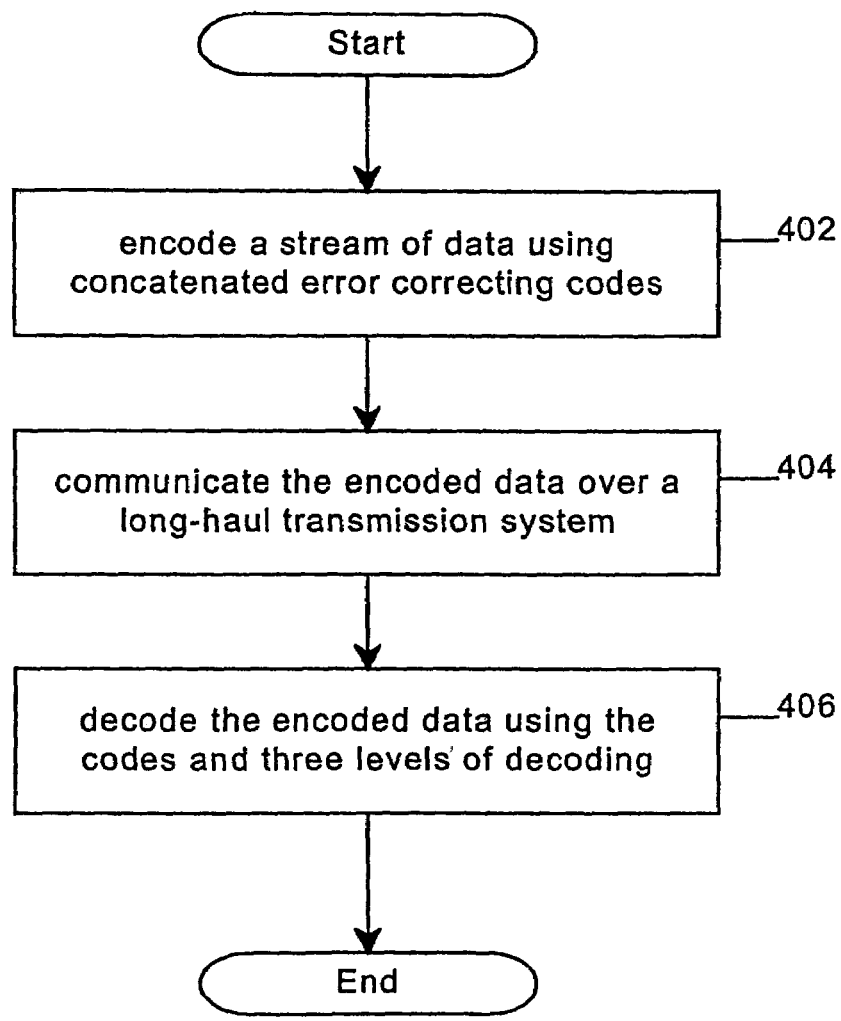
FIG. 4 is a block flow diagram of the operations performed by an FEC coder/decoder (codec) in accordance with one embodiment of the invention.
Figure 5:
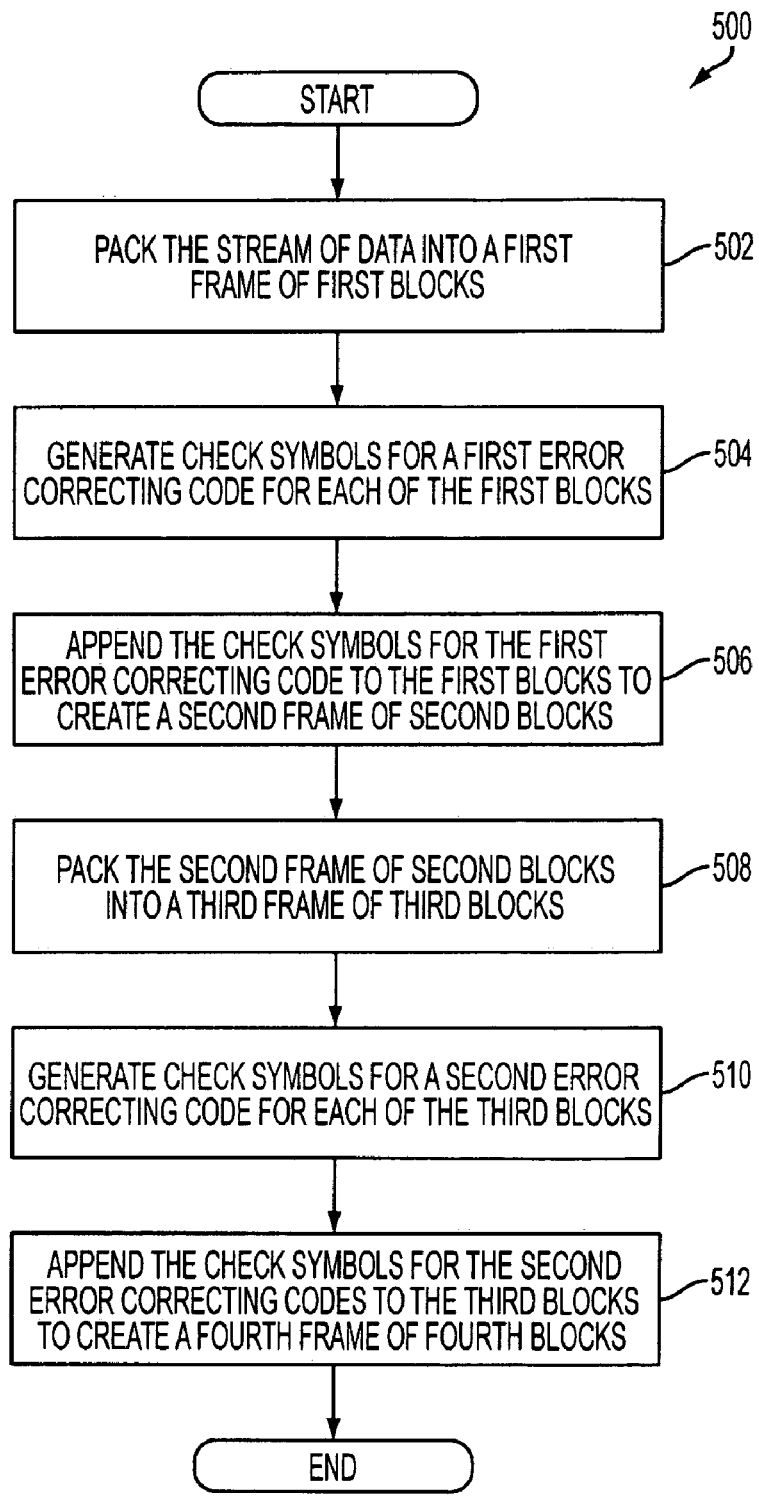
FIG. 5 is a block flow diagram of an encoding process in accordance with one embodiment of the invention.
Figure 6:
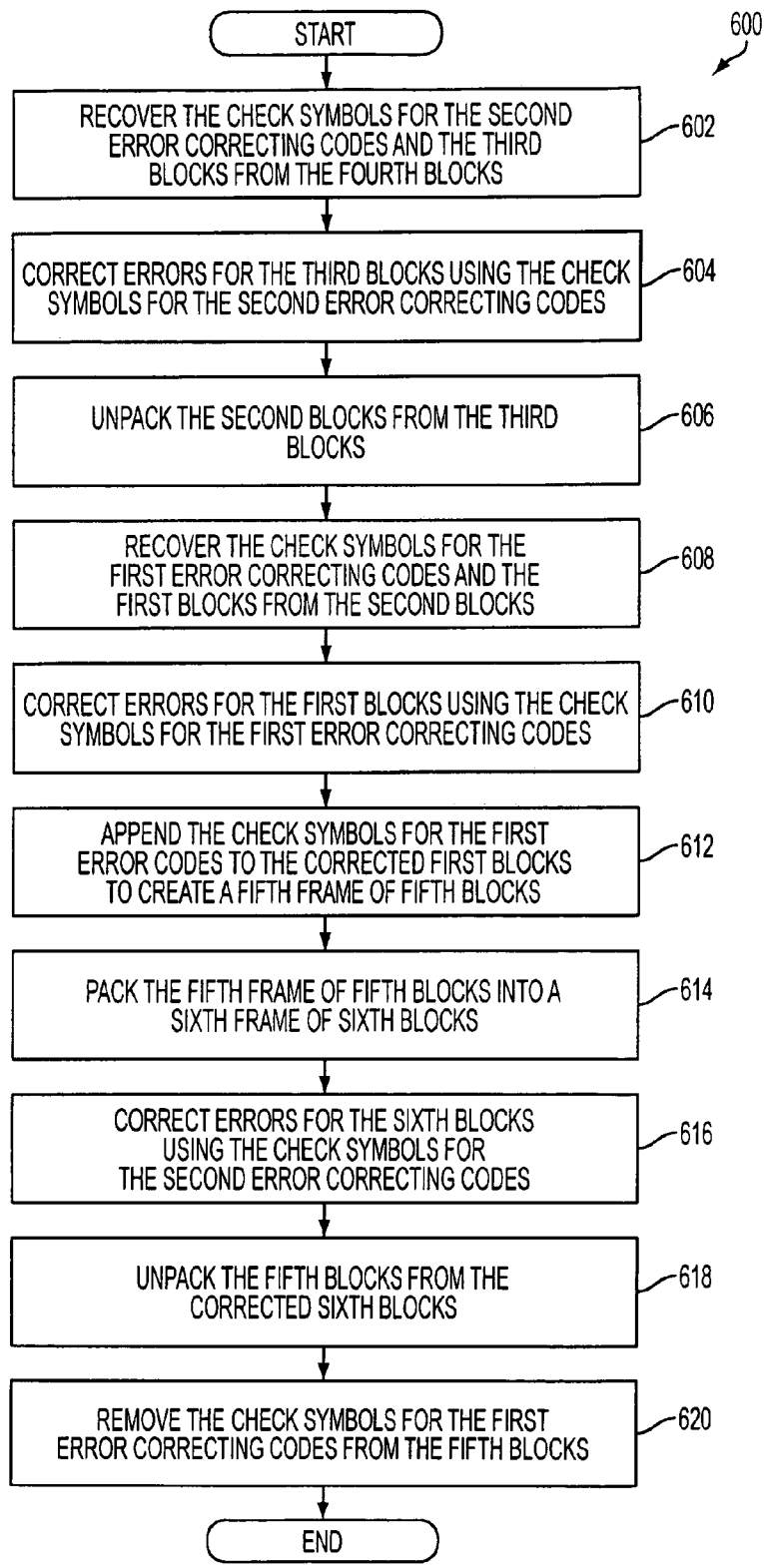
FIG. 6 is a block flow diagram of a decoding process in accordance with one embodiment of the invention.

The operation of systems 100, 200 and 300 will be described in more detail with reference to FIGS. 4–6. Although FIGS. 4–6 presented herein include a particular sequence of steps, it can be appreciated that the sequence of steps merely provides an example of how the general functionality described herein can be implemented. Further, each sequence of steps does not have to be executed in the order presented unless otherwise indicated.

FIG. 4 is a block flow diagram of an FEC process 400 consistent with one embodiment of the invention. In this embodiment of the invention, FEC encoder 202 performs the FEC encoding. A stream of data is encoded using concatenated error correcting codes at step 402. The encoded data is communicated over a long-haul transmissions system at step 404. In one embodiment of the invention the long-haul transmission system communicates the encoded data at least 600 kilometers. The encoded data is decoded using the error correcting codes and three levels of decoding at step 406.

FIG. 5 is a block flow diagram of an encoding process in accordance with one embodiment of the invention. FIG. 5 illustrates an encoding process 500 that is representative of step 402 described with reference to FIG. 4. The stream of data is packed into a first frame of first blocks at step 502. The first frame is also referred to herein as an "unencoded outer frame." Check symbols for a first error correcting code are generated for each of the first blocks at step 504. The check symbols for the first error correcting code are appended to the first blocks to create a second frame of second blocks at step 506. The second frame is also referred to herein as an "encoded outer frame." The second frame of second blocks is packed into a third frame of third blocks at step 508. The third frame is also referred to herein as an "unencoded inner frame." The check symbols for the second error correcting code are generated for each of the third blocks at step 510. The check symbols for the second error correcting code are appended to the third blocks to create a fourth frame of fourth blocks at step 512. The fourth frame is also referred to herein as an "encoded inner frame."

The first frame, second frame, third frame and fourth frame each have a predetermined length. In one embodiment of the invention, the length of the second frame matches the length of the third frame. In this manner, no padding is required for the third frame. This decreases the latency associated with such padding hardware and techniques. In alternative embodiments, however, the length of the second frame is less than the length of said third frame. In such a case, the third frame is padded with padding symbols until the length of the third frame matches the length of the second frame. In this case, the increase in FEC coding efficiency is sufficient to compensate for the latency incurred by padding.

The embodiments of the invention use interleaving during the encoding and decoding process. More particularly, the interleaving operation occurs during the packing of the second blocks from the second frame into the third blocks of the third frame, and vice-versa. It can be appreciated, however, that the interleaving process can occur as a separate step from the packing process and still fall within the scope of the invention. The interleaving operation can be either bit interleaving or byte interleaving. In one embodiment of the invention, the third frame has a 1-N of third blocks, with N matching an interleave depth for the encoding process. In one advantageous embodiment N=64, while in another N=16.

The error correcting codes can be any code from a group comprising the linear and cyclic Hamming codes, the cyclic BCH codes, the convolutional Viterbi codes, the cyclic Golay and Fire codes, and some newer codes such as TCC and TPC. The concatenated error correcting code pair may be separately represented as a first and second error correcting code, with the first error correcting code represented as x/y and the second error correcting code represented as z/x. In one embodiment of the invention, the first correcting code is a reed-solomon code. More particularly, the first error correcting code is an x/207 reed-solomon error correcting code. The second error correcting code is also a reed-solomon code. The second error correcting code is a 255/x reed-solomon error correcting code. In one advantageous embodiment of the invention the x is equal to 223 symbols. This two level FEC coding results in a net coding gain of approximately 1.8 decibels while performing at a bit error rate of $10^{-10}$, without taking into account the coding gain given by the third level of decoding which is approximately 0.45 dB (as described more fully below). This embodiment adds a redundancy percentage to the communicated encoded data of approximately 23 percent (including the third level of decoding).

In an alternative embodiment of the invention, the first error correcting code is one of a group comprising a bit based BCH code. The second error correcting is also one of a group comprising a byte based RS code. Further, the first error correcting code is stronger than the second error correcting code.

FIG. 6 is a block flow diagram of a decoding process in accordance with one embodiment of the invention. FIG. 6 illustrates a decoding process 600 having three levels of decoding. In the first level of decoding, the check symbols from the second error correcting code and third blocks are recovered from the fourth blocks at step 602. The check symbols from the second error correcting code are used to correct errors for the third blocks at step 604. In the second level of decoding, the second blocks are unpacked from the third blocks at step 606. The unpacking process also includes a deinterleaving operation described below. The check symbols from the first error correcting code and first blocks are recovered from the second blocks at step 608. The check symbols from the first error correcting code are used to correct errors for the first blocks at step 610. In the third level of decoding, the check symbols from the second error code are appended to the corrected first blocks to create a fifth frame of fifth blocks at step 612. The fifth frame of fifth blocks is packed into a sixth frame of sixth blocks at step 614. The packing process also includes an interleaving operation described below. The check symbols from the second error correcting code are used to correct errors for the sixth blocks at step 616. The fifth blocks are unpacked from the corrected sixth blocks at step 618. The unpacking process also includes the deinterleaving operation described below. The check symbols from the second error correcting code are removed from the fifth blocks to leave the received corrected data at step 620.

Figure 7:
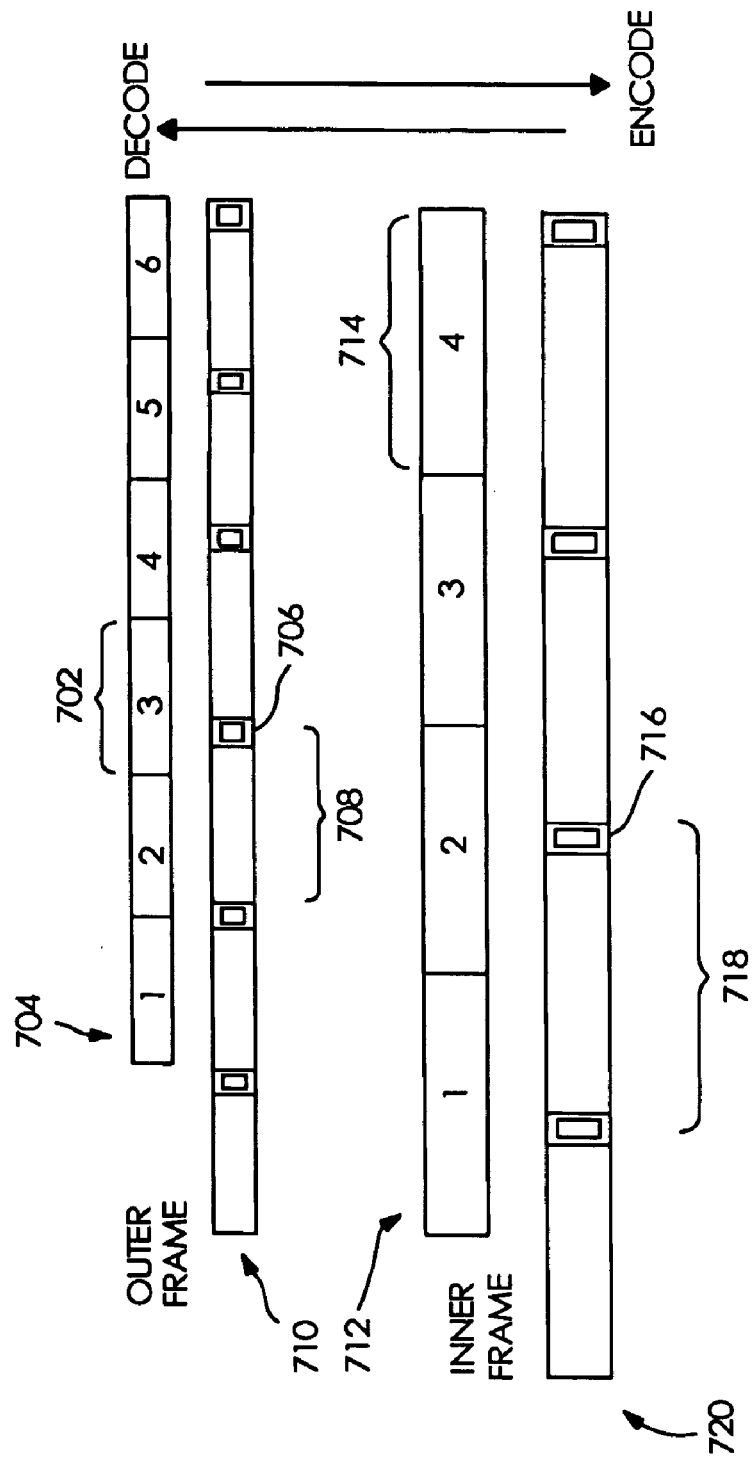
FIG. 7 is an illustration of how code blocks are packed into a frame in the encoding step.

FIG. 7 is an illustration of how data are packed into a frame in the encoding step. An integral number of first blocks 702 at the first (outer) encoding level are packed into a first frame 704 (i.e., the unencoded outer frame). Check symbols 706 for first blocks 702 are generated by a first encoder (e.g. first encoder 204) of an FEC encoder (e.g. FEC encoder 104 or FEC encoder 200). Check symbols 706 are appended to first blocks 702 to form second blocks 708. Second blocks 708 are packed into a second frame 710 (i.e. the encoded outer frame). The bits (or bytes) from second blocks 708 are interleaved, and they are packed into third blocks 714 of a third frame 712 (i.e. unencoded inner frame). In this example, second frame 710 and third frame 712 have the same length in terms of bits (or bytes), although the block size will likely vary between the two frames. In other words, third frame 712 is required to be an integral number of third blocks 714, the size of which is different from that of second blocks 708. Thus, in order for second frame 710 and third frame 712 to be of the same length, the number of second blocks 708 and third blocks 714 per frame in each of these frames, respectively, has to be chosen appropriately.

If second frame 710 and third frame 712 cannot be made to match with an integral number of blocks, third frame 712 is padded or "stuffed" with dummy symbols until they are of equal length. The padding process, however, represents an increase in latency in a hardware implementation, or increased processing time in software. In one embodiment of the invention, the lengths of the frames are therefore chosen to minimize the number (or reduce to zero) of stuffed symbols, while at the same time keeping the number of second blocks per second frame to a minimum.

Once second blocks 708 from second frame 710 are packed and interleaved into third blocks 714 of third frame 712, check symbols 716 are generated for third blocks 714 by a second encoder (e.g. second encoder 208) of an FEC encoder (e.g. FEC encoder 104 or FEC encoder 200). Check symbols 716 are appended to third blocks 714 to form a set of fourth blocks 718 of a fourth frame 720 (i.e. the encoded inner frame). Once the two-level encoding process is performed, the encoded data stream is communicated to a transceiver (e.g. transceiver 108) for decoding by an FEC decoder (e.g. FEC decoder 110 or FEC decoder 300).

Figure 8:
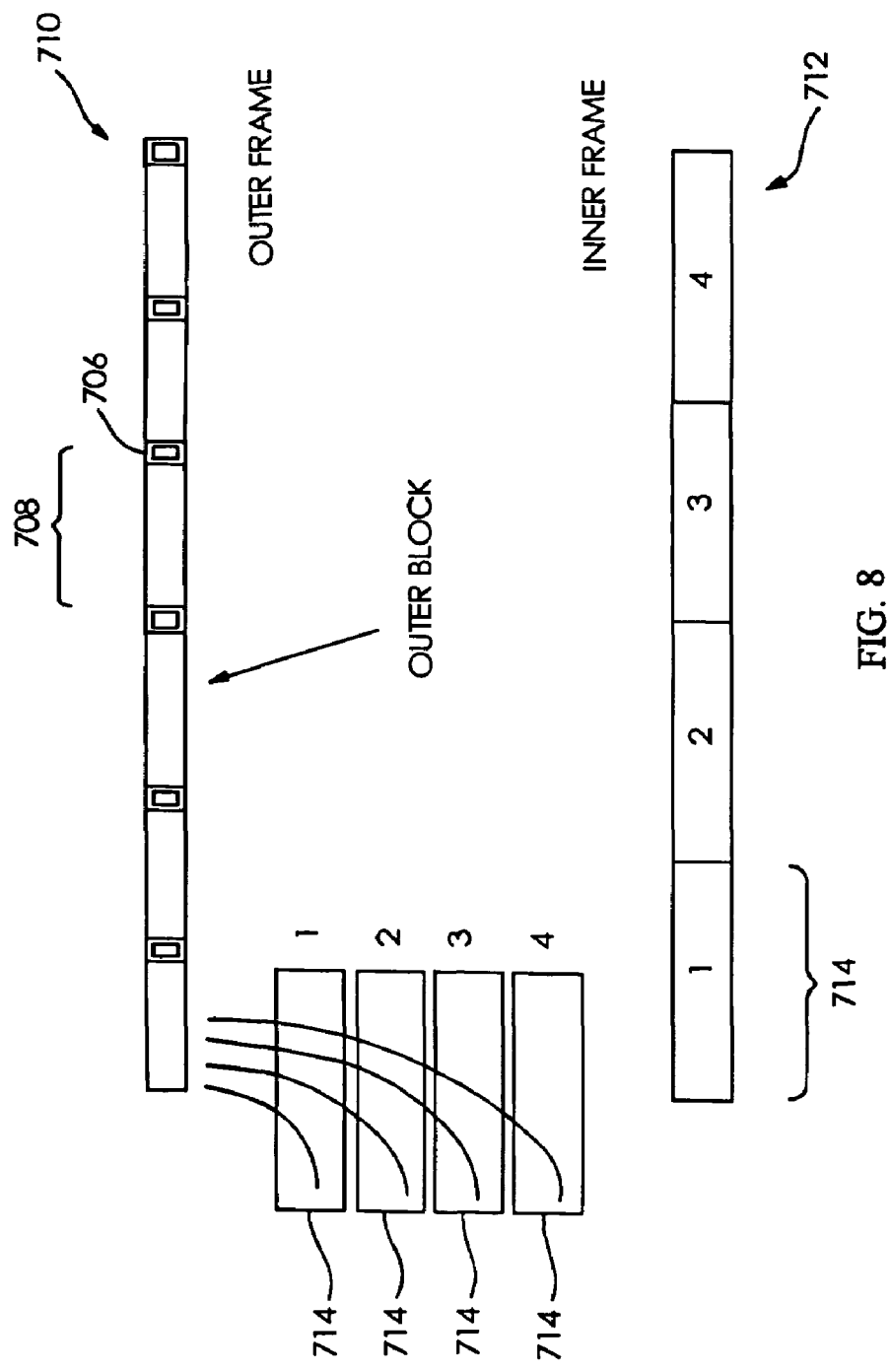
FIG. 8 is an illustration of the interleaving process in accordance with one embodiment of the invention.

FIG. 8 is an illustration of the interleaving process in accordance with one embodiment of the invention. As shown in FIG. 8, interleaving between the two encoding steps discussed with reference to FIG. 7 (between packing the second and third frames) amounts to re-distributing the errors in bit-groupings or bytes that are either 1-bit or 8-bits long. FIG. 8 illustrates an example of byte interleaving after second frame 710 is encoded. The improvement in error correction is directly related to the depth of interleaving. Using the example illustrated in FIG. 8, full byte (or symbol) interleaving requires that each of the 223 symbols in each second block 708 (i.e. the outer frame) is re-distributed into 223 different third blocks 714 (i.e. the inner frame). In the case of full interleaving, the 223 symbols would require an interleave depth of 223 levels or 223 third blocks 714. If full bit interleaving were required in this case, each of the 223×8 bits in each of second blocks 708 would be re-distributed into 223×8=1784 different third blocks 714. In this case, the interleave depth is 1784 levels. Although full bit or byte interleaving improves the error correction, the disadvantage of full interleaving is the large amount of memory required and the additional latency in a practical implementation.

As mentioned previously, steps 606 and 618 refer to an unpacking process that includes a deterinterleaving process. The deinterleaving process essentially reverses the interleaving process described with reference to FIG. 8.

The operation of systems 100, 200 and 300, and the flow diagram shown in FIGS. 4–6, can be better understood by way of example. As described above, the concatenated RS codes involve two independent levels of RS encoding, with an interleaving step in between them. The decoding process includes three independent levels of RS decoding with a deinterleaving step in between levels one and two, and an interleaving step and deinterleaving step between levels two and three.

As stated previously, the three level decoding process described with reference to FIG. 6 provides a coding gain of approximately 0.45 dB without adding any redundancy to the transmitted signal. A transmitter such as transmitter 101 prepares a stream of data for transmission over transmission line 106. Transmitter 102 utilizes FEC encoder 110 104 to encode the data stream prior to transmission over transmission line 106. The encoded data stream is then transmitted over transmission line 106 to receiver 107. Receiver 108 receives the encoded data stream and begins the decoding process using FEC decoder 110. FEC decoder 110 performs three levels of decoding.

The first level of decoding is performed by decoder 304 (i.e. inner decoder) of decoder 300 (that is part of FEC receiver 107). Decoder 304 receives the fourth frame of fourth blocks (i.e. the encoded inner frame) and recovers the check symbols from the second error correcting code (i.e. inner codes) and third blocks (i.e. of the third frame) from the fourth blocks. Decoder 304 corrects errors for the third blocks using the check symbols from the second error correcting code. The level of error correction is determined by the strength of the particular second error correcting code.

The second level of decoding is performed by decoder 308 (i.e. outer decoder) of decoder 300. The corrected third blocks are received by deinterleaver 306. Deinterleaver 306 reverses the interleaving process used to pack the second blocks of the second frame into the third blocks of the third frame during the encoding process. The unpacking and deinterleaving process produces the second blocks of the second frame from the third blocks. Decoder 308 receives the second blocks and recovers the check symbols from the first error correcting code (i.e. outer codes) and the first blocks (i.e. original data) from the second blocks. Decoder 308 corrects errors for the first blocks according to the particular strength of the first error correcting code.

The third level of decoding is performed by decoder 312 (i.e. inner decoder) of decoder 300. The third level of decoding utilizes the check symbols from the second error correcting code (i.e. inner code) to correct errors in the corrected first and third blocks. This builds upon the basic premise of concatenated codes. To the extent the inner decoder cannot correct all the errors in the received information, the deinterleaver and the outer decoder may correct any unresolved errors. There may be an instance, depending on the strength of the inner and outer codes, where a number of errors remain despite the first two levels of decoding. By reformulating the corrected data into the same format as originally received (i.e. the third blocks), the corrected data (which may still have some uncorrected errors) can be sent through the inner decoder again in an attempt to correct any remaining errors. Although it seems that additional coding gain could be achieved by resending the received information through the outer decoder again, this is typically not effective for several reasons. First, the inner decoder typically utilizes the strongest error correcting code due to the advantages gained in terms of efficiency versus redundancy. Consequently, the greatest amount of additional error correction would come from the inner decoder. Second, the outer decoder provides relatively little, if any, additional coding gains, as demonstrated in FIG. 9.

Figure 9:
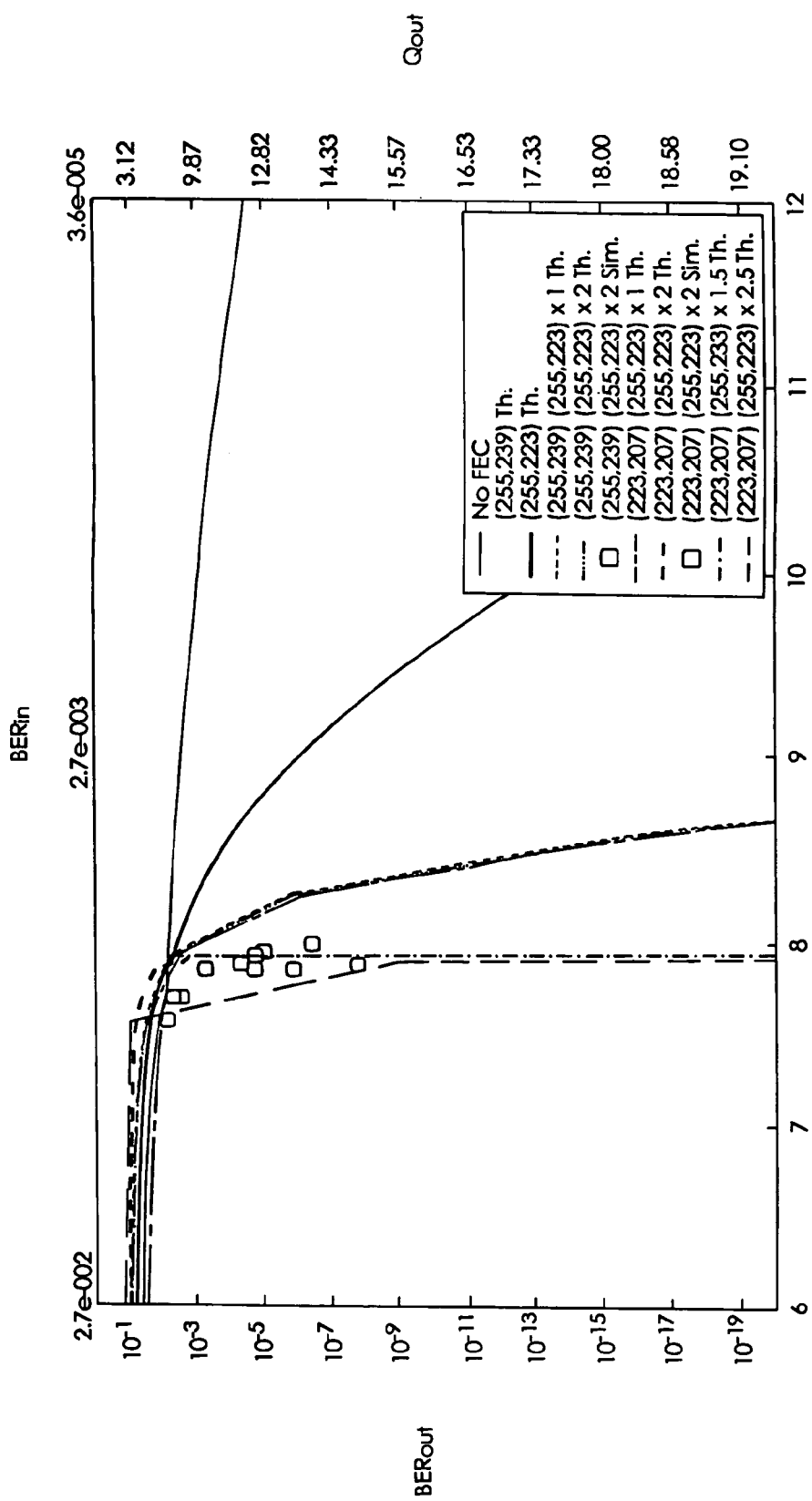
FIG. 9 is a plot of coding gains from three level and four level decoding in accordance with one embodiment of the invention.

FIG. 9 is a plot of coding gains from three level and four level decoding in accordance with one embodiment of the invention. As illustrated in FIG. 9, the third level decoding (i.e. sending the data through the inner decoder again) and fourth level decoding (i.e. sending the data through the outer decoder again) both result in the same additional FEC gain of approximately 0.45 dB. Therefore, by sending the data through a fourth level of decoding would merely add latency without any appreciable coding gain for the system.

Returning again to our example of the third level decoding, the third blocks must be reconstructed prior to sending them through the inner decoder again (e.g. a decoder 312). Thus, the first error codes are appended to the corrected first blocks to create a fifth frame of fifth blocks. The fifth frame of fifth blocks equates to the reconstructed second frame of second blocks. The fifth frame of fifth blocks is packed into a sixth frame of sixth blocks. The sixth frame of sixth blocks equates to the reconstructed third frame of third blocks. This is accomplished by sending the fifth frame of fifth blocks through interleaver 310. Decoder 312 receives the sixth blocks, uses the second check symbols to correct errors for the sixth blocks, and sends the corrected sixth blocks to deinterleaver 314. Deinterleaver 313 unpacks and deinterleaves the fifth blocks from the corrected sixth blocks. The first check symbols are removed from the fifth blocks to leave the outgoing data.

Decoding consistent with the invention may be implemented in connection with a variety of concatenated code types. For example, additional coding gain may be achieved in connection with concatenation of a RS code and a turbo-code. In general, Turbo-codes are implemented using an encoder including at least two component codes separated by an interleaver. The interleaver causes the encoders to be excited by two separate input sequences. Decoding of the turbo-code generally requires at least two separate decoders producing "soft" output. Decoding may be conducted iteratively, using information derived from the output of the first decoder to perform decoding in the second decoder, and vice-versa.

In an embodiment consistent with the invention for use in connection with concatenation of an RS code and a turbo-code, the outer encoder 204 illustrated in FIG. 2 would be an RS encoder, and the inner encoder 208 would be a turbo-code encoder. Also, the inner decoders 304 and 312 illustrated in FIG. 3 would be turbo-code decoders, and the outer decoder 308 would be an RS decoder. The RS and turbo-codes used in such an embodiment may be of a variety of types. For example, the RS code may be a single or multi-level code and/or the turbo-code may be a turbo convolutional code TCC or a turbo product code (TPC). A TPC code is generally composed of a multidimensional array of block codes, such as Hamming and BCH codes. In the simplest configuration the constituent codes can consist solely of parity codes.

While the preceding descriptions such as those describing FIGS. 7 and 8 show a block inner code, it will be appreciated by those skilled in the art that similar implementations are possible where the inner code is a convolutional code such as a TCC.

Figure 10:
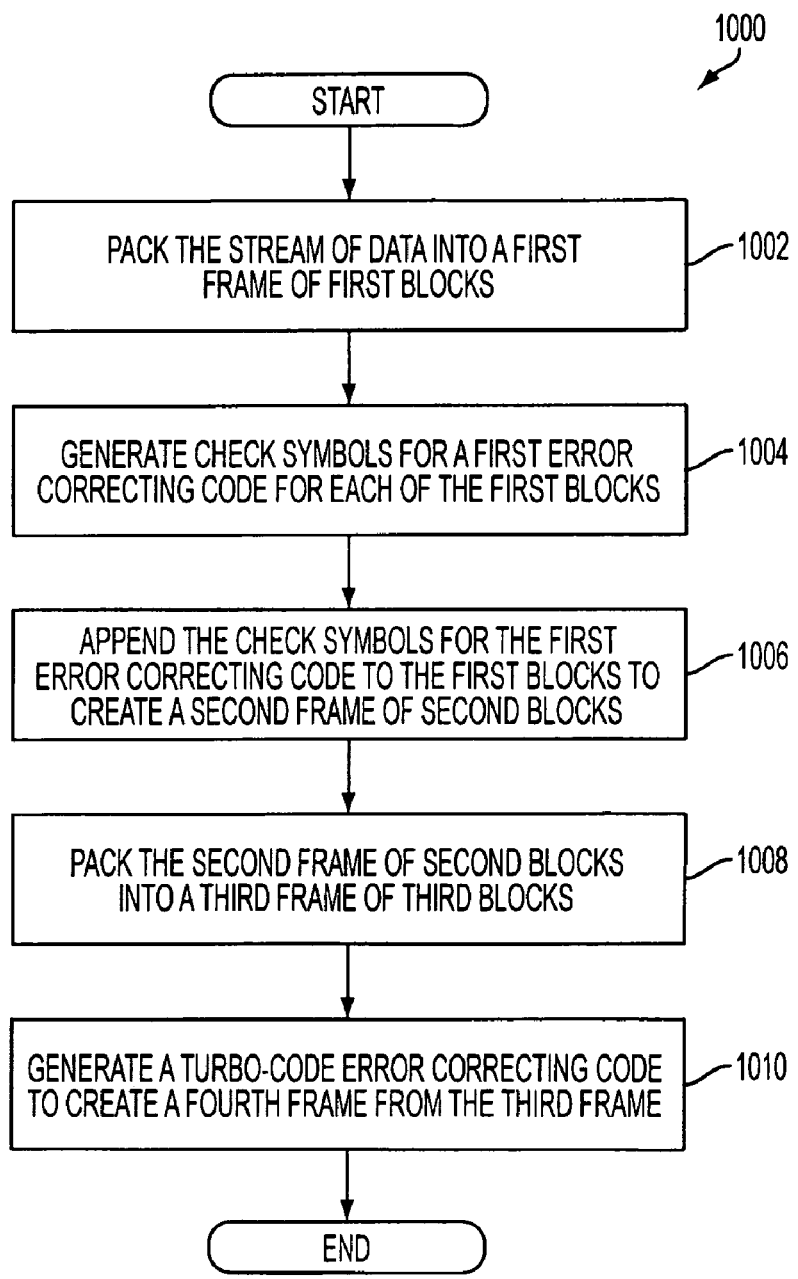
FIG. 10 is a block flow diagram of an encoding process in accordance with another embodiment of the invention.

The operations performed by a communication system consistent with the invention for an embodiment including concatenated RS and turbo codes are the same as those illustrated generally in FIG. 4. FIG. 10 is a block flow diagram illustrating an embodiment of an encoding process 1000 including concatenated RS and turbo product codes that is representative of step 402 described with reference to FIG. 4. The stream of data is packed into a first frame of first blocks at step 1002. The first frame is also referred to herein as an "unencoded outer frame." An RS error correcting code is generated for each of the first blocks at step 1004. The check symbols for the RS error correcting code are appended to the first blocks to create a second frame of second blocks at step 1006. The second frame is also referred to herein as an "encoded outer frame."

The second frame of second blocks is packed into a third frame of third blocks at step 1008. The third frame is also referred to herein as an "unencoded inner frame." Check bits associated with the inner turbo product code are generated for each of the third blocks at step 1010 to create a fourth frame from the third frame. The fourth frame is also referred to herein as an "encoded inner frame."

The first frame, second frame, third frame may each have a predetermined length, while the fourth frame may be viewed as having a predetermined dimensions depending on the type of turbo-code used. As described above with respect to FIG. 5, in one embodiment of the invention, the length of the second frame may match the length of the third frame. In alternative embodiments, however, the third frame may be padded with padding symbols until the length of the third frame matches the length of the second frame. In this case, the increase in FEC coding efficiency is sufficient to compensate for the latency incurred by padding.

The embodiments of the invention, including an embodiment with concatenated RS and turbo codes, use interleaving during the encoding process and deinterleaving during the decoding process. In the embodiment of FIG. 10, the interleaving operation occurs during the packing of the second blocks from the second frame into the third blocks of the third frame at step 1008, and vice-versa. Again, however, the interleaving process can occur as a separate step from the packing process and still fall within the scope of the invention. Although byte interleaving is preferable, the interleaving operation can be either bit interleaving or byte interleaving.

Figure 11:
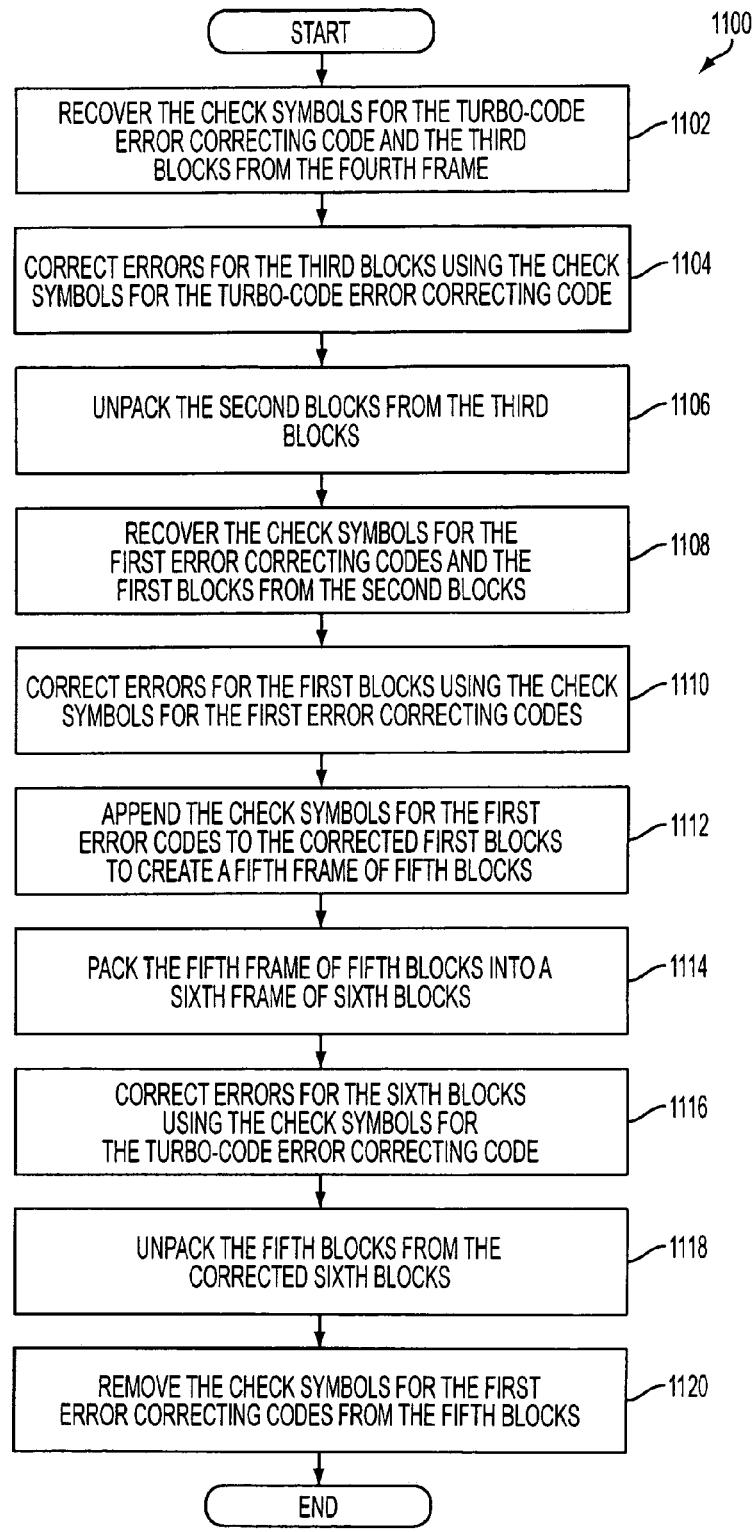
FIG. 11 is a block flow diagram of a decoding process in accordance with another embodiment of the invention.

FIG. 11 is a block flow diagram of a decoding process 1100 in accordance with an embodiment of the invention including concatenated RS and turbo codes. FIG. 11 illustrates three levels of decoding. In the first level of decoding, the turbo-code error correcting code and the third blocks are recovered from the fourth frame at step 1102. The turbo-code error correcting code is used to correct errors for the third blocks at step 1104. In the second level of decoding, the second blocks are unpacked from the third blocks at step 1106. The unpacking process also includes a deinterleaving operation. The check symbols associated with the RS error correcting code and the first blocks are recovered from the second blocks at step 1108. The check symbols from the RS error correcting code are used to correct errors for the first blocks at step 1110.

In the third level of decoding, the check symbols from the first error code are appended to the corrected first blocks to create a fifth frame of fifth blocks at step 1112. The fifth frame of fifth blocks is packed into a sixth frame of sixth blocks at step 1114. The packing process also includes an interleaving operation. The turbo-code check bits are used to correct errors for the sixth blocks at step 1116. The fifth blocks are unpacked from the corrected sixth blocks at step 1118. The unpacking process also includes a deinterleaving operation. The check symbols from the first error correcting code are removed from the fifth blocks to leave the received corrected data at step 1120.

Figure 12:
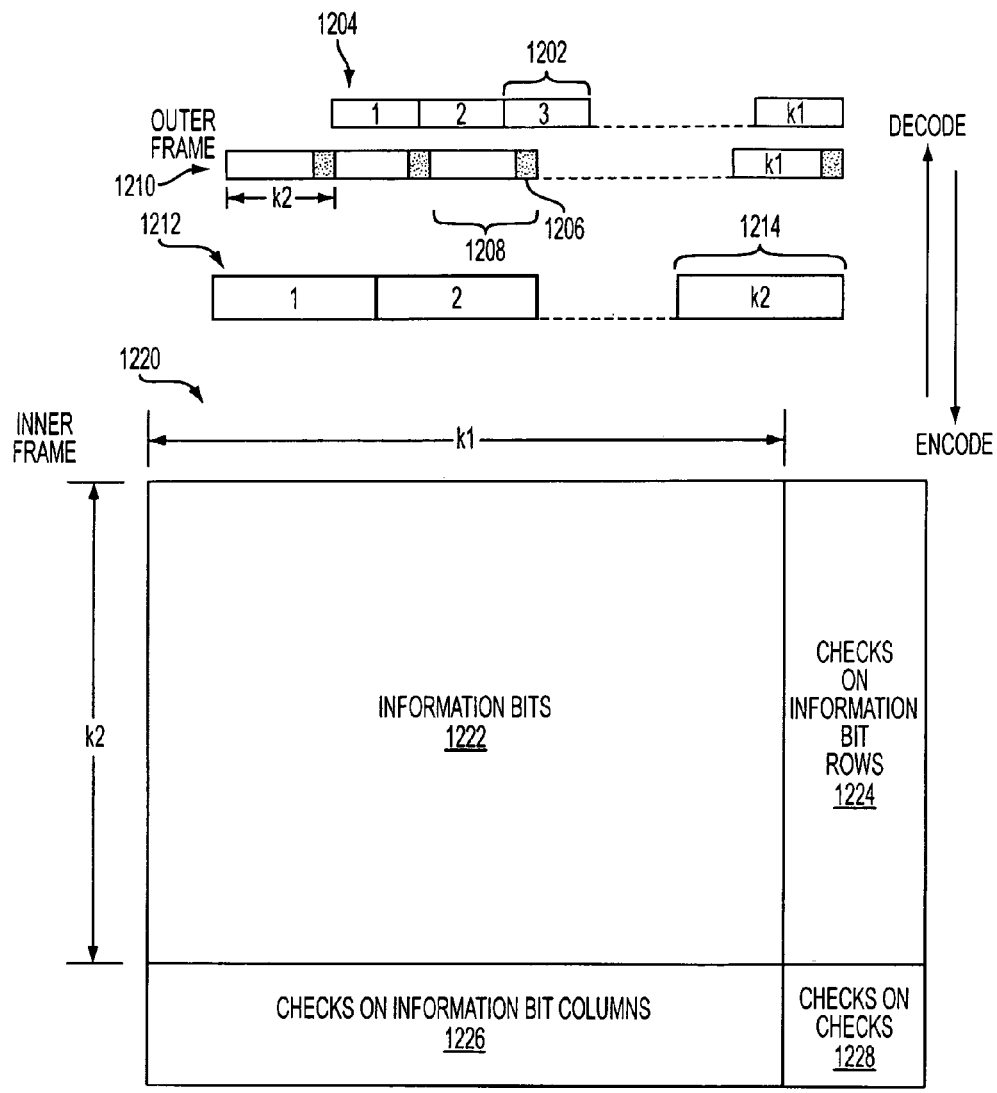
FIG. 12 is an illustration of packing code blocks into a frame in accordance with another embodiment of the invention.

FIG. 12 illustrates an exemplary embodiment of how code blocks are packed into a fourth frame in the encoding step for an embodiment including concatenated RS and TPC codes. For ease of explanation, the illustrated embodiment includes concatenation of a RS code with a two-dimensional TPC code. It is to be understood, however, that a variety of RS and turbo-codes may be useful in connection with the invention.

The illustrated exemplary embodiment also includes full byte interleaving in packing blocks from the second frame into the third frame. The degree of interleaving effects system performance since higher levels of interleaving result greater decorrelation of errors between the RS and TPC codes. The level of interleaving, however, also affects latency, processing time, and overall system complexity and cost. Thus, the benefits of a selected interleaving depth should be balanced against the associated cost in terms of system complexity. As discussed above, byte interleaving is generally sufficient to achieve an appropriate performance/complexity balance. It is to be understood, however, that the present invention is not limited to any particular interleaving approach. In fact, embodiments of the present invention may include full or partial byte interleaving or full or partial bit interleaving.

In the exemplary embodiment illustrated in FIG. 12, an integral number k1 of first blocks 1202 at the first (outer) encoding level are packed into a first frame 1204 (i.e. the unencoded outer frame). Check symbols 1206 for first blocks 1202 are generated by an RS encoder (e.g. first encoder 204) of an FEC encoder (e.g. FEC encoder 104 or FEC encoder 200). Check symbols 1206 are appended to first blocks 1202 to form second blocks 1208. Second blocks 1208 are packed into a second frame 1210 (i.e. the encoded outer frame). In the illustrated exemplary embodiment, each of the k2 bytes from each of the second blocks 1208 are interleaved, and they are packed into third blocks 1214 of a third frame 1212 (i.e. unencoded inner frame). In one embodiment, interleaving of the bytes may be performed, for example, as illustrated in FIG. 8.

In this example, the second frame 1210 and third frame 1212 have the same length in terms of bits (or bytes), although the block sizes will likely vary between the two frames. In other words, the third frame 1212 is required to be an integral number of third blocks 1214, the size of which is different from that of second blocks 1208. Thus, in order for second frame 1210 and third frame 1212 to be of the same length, the number of second blocks 1208 and third blocks 1214 per frame in each of these frames, respectively, has to be chosen appropriately.

If second frame 1210 and third frame 1212 cannot be made to match with an integral number of blocks, third frame 1212 may be padded or "stuffed" with dummy symbols until they are of equal length. The padding process, however, represents an increase in latency in a hardware implementation, or increased processing time in software. In one embodiment of the invention, the lengths of the frames are therefore chosen to minimize the number (or reduce to zero) of stuffed symbols, while at the same time keeping the number of second blocks per second frame to a minimum.

Once second blocks 1208 from second frame 1210 are packed into third blocks 1214 of third frame 1212, the third frame is encoded with the TPC code by the TPC encoder (e.g. second encoder 208) of an FEC encoder (e.g. FEC encoder 104 or FEC encoder 200). Those skilled in the art will recognize that an exemplary two-dimensional TPC encoder may include a combination of two simple encoders, e.g. recursive convolutional encoders, with an interleaver therebetween. A block of information bits provided at the input of the TPC encoder are transmitted unencoded, along with check symbols generated by the two simple encoders. A first group of check symbols are generated by the first encoder based on the information bits. The information bits are then permuted by the interleaver before being provided to the second encoder. The second encoder produces check symbols based on the interleaved information bits. A variety of commercially available TPC encoders will be known to those skilled in the art.

In the illustrated exemplary embodiment, the TPC encoder produces a fourth frame 1220 using the blocks 1214 of the third frame as the encoder input. The fourth frame may be illustrated as a block having an information bit portion 1222, with three separate check bit portions, 1224, 1226, 1228. In the case of full byte interleaving, as shown in FIG. 12, the information bit portion may include the bits of the third frame distributed in k1 columns and k2 rows. The first check bit portion 1224 includes a check bits row associated with each of the k2 information bit rows, and the second check bit portion 1226 includes a check bit column associated with each of the k1 information bit columns. The third check bit portion 1228 includes check bits derived from the column 1226 and/or row 1224 check bits. Once the two-level encoding process is performed, the encoded data stream is communicated to a transceiver (e.g. transceiver 108) for decoding by an FEC decoder (e.g. FEC decoder 110 or FEC decoder 300).

Again, a decoding process consistent with the invention includes three independent levels of RS decoding with a deinterleaving step in between levels one and two, and an interleaving step and deinterleaving step between levels two and three. This approach provides a coding gain of approximately 0.3–0.5 dB without adding any redundancy to the transmitted signal.

Decoding concatenated RS and turbo codes in a manner consistent with the invention may be accomplished in a manner substantially similar to that described above in connection with concatenated RS codes. The first level of decoding is performed by decoder 304 (i.e. inner decoder) of decoder 300 (that is part of FEC decoder 110). Decoder 304 receives the fourth frame and recovers the turbo-code error correcting code (i.e. inner code) and third blocks (i.e. of the third frame) from the fourth frame. Decoder 304 corrects errors for the third blocks using the turbo-code check symbols. The level of error correction is determined by the strength of the particular turbo-code error correcting code.

The second level of decoding is performed by decoder 308 (i.e. outer decoder) of decoder 300. The corrected third blocks are received by deinterleaver 306. Deinterleaver 306 reverses the interleaving process used to pack the second blocks of the second frame into the third blocks of the third frame during the encoding process. The unpacking and deinterleaving process produces the second blocks of the second frame from the third blocks. Decoder 308 receives the second blocks and recovers the check symbols from the first error correcting code (i.e. outer code) and the first blocks (i.e. original data) from the second blocks. Decoder 308 corrects errors for the first blocks according to the particular strength of the first error correcting code.

The third level of decoding is performed by decoder 312 (i.e. inner decoder) of decoder 300. The third level of decoding utilizes the turbo-code error correcting code (i.e. inner code) to correct errors in the corrected first and third blocks. In general, by reformulating the corrected data into the same format as originally received (i.e. the third blocks), the corrected data (which may still have some uncorrected errors) can be sent through the inner decoder again in an attempt to correct any remaining errors.

Figure 13:
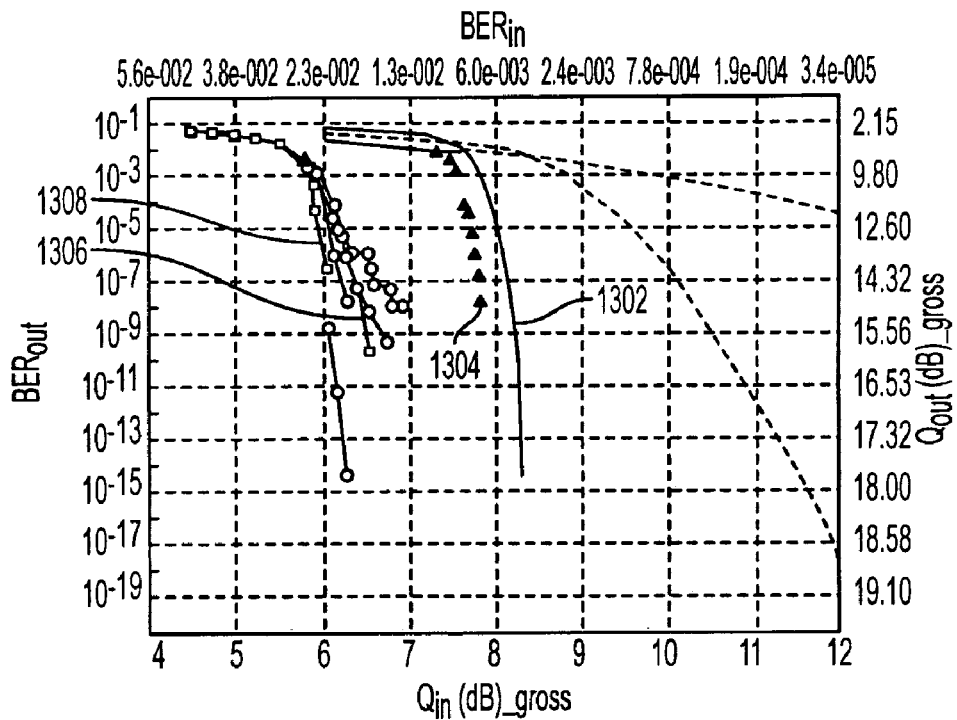
FIG. 13 illustrates plots of the theoretical upper bounds showing BER versus Q in accordance with another embodiment of the invention.

Turning now to FIG. 13, there is provided a plot illustrating coding gains for various RS, TPC, concatenated RS, and concatenated RS and TPC embodiments. In the legend for FIG. 13, the TPC codes are identified in the format "TPC(x,y)" wherein "x" is the total number of columns in the fourth frame, including information bit and check bit columns, and "y" is the total number of information bit columns. The RS codes are identified by (n/k) designation, as described above.

The curve 1302 illustrates the coding gain associated with use of a concatenated RS (223,207) and (255,223) codes with two levels of decoding, and curve 1304 illustrates coding gain associated with use of concatenated RS(223, 207) and RS (255,223) codes using three levels of decoding consistent with the invention. The curve 1306 illustrates the coding gain associated with use of a concatenated TPC (88,80) and RS (255,247) codes with two levels of decoding, and curve 1308 illustrates coding gain associated with use of concatenated TPC (88,80) and RS (255,247) codes using three levels of decoding consistent with the invention. As shown, use of three levels of decoding in a manner consistent with the invention allows for coding gains of approximately 0.3 to 0.5 dB. Advantageously, this coding gain may be achieved without modification of the associated encoder, and without adding any redundancy to the transmitted signal.

Although various embodiments are specifically illustrated and described herein, it will be appreciated that modifications and variations of the present invention are covered by the above teachings and within the purview of the appended claims without departing from the spirit and intended scope of the invention. For example, although an additional decoder and deinterleaver is shown as part of decoder 300, it can be appreciated that the functions of decoder 312 and deinterleaver 314 may be accomplished using decoder 304 and deinterleaver 306, respectively, using the appropriate routing circuitry, and still fall within the scope of the invention.

In another example, it will be appreciated that the functionality described for the embodiments of the invention may be implemented in hardware, software, or a combination of hardware and software, using well-known signal process techniques. If in software, a processor and machine-readable medium is required. The processor can be any type of processor capable of providing the speed and functionality required by the embodiments of the invention. For example, the processor could be a processor from the Pentium® family of processors made by Intel Corporation, or the family of processors made by Motorola. Machine-readable media include any media capable of storing instructions adapted to be executed by a processor. Some examples of such media include, but are not limited to, read-only memory (ROM), random-access memory (RAM), programmable ROM, erasable programmable ROM, electronically erasable programmable ROM, dynamic RAM, magnetic disk (e.g. floppy disk and hard drive), optical disk (e.g. CD-ROM), and any other device that can store digital information. In one embodiment, the instructions are stored on the medium in a compressed and/or encrypted format.

As used herein, the phrase "adapted to be executed by a processor" is meant to encompass instructions stored in a compressed and/or encrypted format, as well as instructions that have to be compiled or installed by an installer before being executed by the processor. Further the processor and machine-readable medium may be part of a larger system that may contain various combinations of machine-readable storage devices through various I/O controllers, which are accessible by the processor and which are capable of storing a combination of computer program instructions and data. Finally, in another example, the embodiments were described in a communication network. A communication network, however, can utilize an infinite number of network devices configured in an infinite number of ways. The communication network described herein is merely used by way of example, and is not meant to limit the scope of the invention.

What is claimed is:

1. A method of performing error correction comprising:
   encoding a stream of data using concatenated reed-solomon and turbo-code error correcting codes comprising, packing said stream of data into a first frame of first blocks, generating said reed-solomon error correcting code for each of said first blocks, appending check symbols of said reed-solomon code to said first blocks to create a second frame of second blocks, packing said second frame of said second blocks into a third frame of third blocks comprising interleaving said second blocks into said third blocks, and generating said turbo-code error correcting code using said third blocks to create a fourth frame;
   communicating said encoded data over a transmission system; and
   decoding said encoded data using said reed-solomon and turbo-code error correcting codes and three levels of decoding comprising:
   recovering check bits of said turbo-code error correcting code and said third blocks from said fourth frame;
   correcting errors for said third blocks using said turbo-code error correcting code check bits;
   unpacking said second blocks from said third blocks;
   recovering said reed-solomon error correcting code check symbols and said first blocks from said second blocks;
   correcting errors for said first blocks using said reed-solomon error correcting code check symbols;
   appending said reed-solomon error correcting code check symbols to said corrected first blocks to create a fifth frame of fifth blocks;
   packing said fifth frame of fifth blocks into a sixth frame of sixth blocks;
   correcting errors for said sixth blocks using said turbo-code error correcting code;
   unpacking said fifth blocks from said corrected sixth blocks; and
   removing said reed-solomon error correcting code check symbols from said fifth blocks.

2. The method of claim 1, wherein said transmission system is a long-haul transmission system.

3. The method of claim 2, wherein said long-haul transmission system communicates said encoded data at least 600 kilometers.

4. The method of claim 1, wherein said unpacking said second blocks from said third blocks comprises deinterleaving said third blocks into said second blocks.

5. The method of claim 1, wherein said packing said fifth frame comprises interleaving said fifth blocks into said sixth blocks.

6. The method of claim 1, wherein said unpacking said fifth blocks comprises deinterleaving said corrected sixth blocks into said fifth blocks.

7. The method of claim 1, wherein said reed-solomon error correcting code is an 223/207 reed-solomon error correcting code.

8. The method of claim 1, wherein said reed-solomon error correcting code is (255/247) code and said turbo-code is a (64,57) turbo product code.

9. The method of claim 1, wherein said turbo-code is selected from a group consisting of: turbo convolutional codes and turbo product codes.

10. A machine-readable medium whose contents cause a computer system to perform forward error correcting comprising:
    encoding a stream of data using concatenated reed-solomon and turbo-code error correcting codes comprising, packing said stream of data into a first frame of first blocks, generating said reed-solomon error correcting code for each of said first blocks, appending check symbols of said reed-solomon code to said first blocks to create a second frame of second blocks, packing said second frame of said second blocks into a third frame of third blocks comprising interleaving said second blocks into said third blocks, and generating said turbo-code error correcting code using said third blocks to create a fourth frame;
    communicating said encoded data over a transmission system; and
    decoding said encoded data using said reed-solomon and turbo-code error correcting codes and three level of decoding comprising:
    recovering said turbo-code error correcting code and said third blocks from said fourth frame;
    correcting errors for said third blocks using said turbo-code error correcting code;
    unpacking said second blocks from said third blocks;
    recovering said reed-solomon error correcting code check symbols and said first blocks from said second blocks;
    correcting errors for said first blocks using said reed-solomon error correcting code check symbols;
    appending said reed-solomon error correcting code check symbols to said corrected first blocks to create a fifth frame of fifth blocks;
    packing said fifth frame of fifth blocks into a sixth frame of sixth blocks;
    correcting errors for said sixth blocks using said turbo-code error correcting code;
    unpacking said fifth blocks from said corrected sixth blocks; and
    removing said reed-solomon error correcting code check symbols from said fifth blocks.

11. The machine-readable medium of claim 10, wherein said transmission system is a long-haul transmission system.

12. The machine-readable medium of claim 11, wherein said long-haul transmission system communicates said encoded data at least 600 kilometers.

13. The machine-readable medium of claim 10, wherein said unpacking said second blocks from said third blocks comprises deinterleaving said third blocks into said second blocks.

14. The machine-readable medium of claim 10, wherein said packing said fifth frame comprises interleaving said fifth blocks into said sixth blocks.

15. The machine-readable medium of claim 10, wherein said unpacking said fifth blocks comprises deinterleaving said corrected sixth blocks into said fifth blocks.

16. The machine-readable medium of claim 10, wherein said reed-solomon error correcting code is an 223/207 reed-solomon error correcting code.

17. The machine-readable medium of claim 10, wherein said reed-solomon error correcting code is (255/247) code and said turbo-code is a (64,57) turbo product code.

18. The machine-readable medium of claim 10, wherein said turbo-code is selected from a group consisting of: turbo convolutional codes and turbo product codes.

* * * * *